United States Patent
Xie et al.

(10) Patent No.: US 11,500,257 B2
(45) Date of Patent: Nov. 15, 2022

(54) INORGANIC SOLID-STATE ELECTROCHROMIC MODULE CONTAINING INORGANIC TRANSPARENT CONDUCTIVE FILM

(71) Applicant: Xiamen University of Technology, Xiamen (CN)

(72) Inventors: An Xie, Xiamen (CN); Ling Zhang, Xiamen (CN); Guang Cao, Xiamen (CN); Yuechan Li, Xiamen (CN); Dongya Sun, Xiamen (CN); Minshu Zhang, Xiamen (CN); Liang Yang, Xiamen (CN); Chunyan Cao, Xiamen (CN)

(73) Assignee: XIAMEN UNIVERSITY OF TECHNOLOGY, Xiamen (CN)

( * ) Notice: Subject to any disclaimer, the term of this patent is extended or adjusted under 35 U.S.C. 154(b) by 86 days.

(21) Appl. No.: 16/840,468

(22) Filed: Apr. 6, 2020

(65) Prior Publication Data
US 2021/0311367 A1 Oct. 7, 2021

(51) Int. Cl.
| | | |
|---|---|---|
| *G02F 1/1523* | (2019.01) | |
| *G02F 1/1524* | (2019.01) | |
| *G02F 1/153* | (2006.01) | |
| *G02F 1/155* | (2006.01) | |
| *C23C 14/08* | (2006.01) | |
| *C23C 14/18* | (2006.01) | |
| *C23C 14/34* | (2006.01) | |

(52) U.S. Cl.
CPC .......... *G02F 1/1523* (2013.01); *G02F 1/1524* (2019.01); *G02F 1/1525* (2013.01); *C23C 14/086* (2013.01); *C23C 14/185* (2013.01); *C23C 14/3464* (2013.01); *G02F 1/155* (2013.01); *G02F 1/1533* (2013.01); *G02F 2001/1536* (2013.01); *G02F 2001/1555* (2013.01)

(58) Field of Classification Search
CPC .... G02F 1/1523; G02F 1/1524; G02F 1/1525; G02F 1/1533; G02F 1/155; G02F 2001/1536; G02F 2001/1555; C23C 14/086; C23C 14/185; C23C 14/3464
See application file for complete search history.

(56) References Cited

U.S. PATENT DOCUMENTS

| | | | |
|---|---|---|---|
| 2006/0033978 A1* | 2/2006 | Morin | B32B 17/1077 359/265 |
| 2007/0002420 A1* | 1/2007 | Rukavina | G02F 1/1533 359/265 |
| 2010/0079844 A1* | 4/2010 | Kurman | G02F 1/155 359/266 |

(Continued)

FOREIGN PATENT DOCUMENTS

CN 109613781 A * 4/2019

*Primary Examiner* — George G. King

(57) ABSTRACT

An inorganic solid-state electrochromic module containing an inorganic transparent conductive film, including a transparent substrate and a first transparent conductive layer, a first transparent metal layer, a first transparent protective layer, an inorganic electrochromic layer, an inorganic ion conductive layer, an inorganic ion storage layer, a second transparent metal layer, a second transparent protective layer, a second transparent conductive layer, a encapsulating film and a transparent front plate successively formed on the transparent substrate.

6 Claims, 3 Drawing Sheets

(56) References Cited

U.S. PATENT DOCUMENTS

2015/0140727 A1* 5/2015 Jeong .................... H01L 51/445
                                                                     438/98
2018/0095337 A1* 4/2018 Rozbicki ................. G02F 1/155

* cited by examiner

| Sample | Glass Thickness (mm) | Total Thickness of Transparent Conductive Film (nm) | Visible Light Transmittance (%) | Sheet Resistance ($\Omega$/sq.) | Shading Coefficient |
|---|---|---|---|---|---|
| Marketed products | 2 | 300 | 81% | 9.2 | 1.2 |
| Embodiment 1 | 2 | 113 | 85% | 5.6 | 0.9 |
| Embodiment 2 | 2 | 98 | 86% | 4.6 | 0.9 |

Fig. 5

INORGANIC SOLID-STATE ELECTROCHROMIC MODULE CONTAINING INORGANIC TRANSPARENT CONDUCTIVE FILM

TECHNICAL FILED

The present disclosure relates to the technical field of building materials, in particular to an inorganic solid-state electrochromic module containing an inorganic transparent conductive film.

BACKGROUND

Electrochromism refers to the phenomenon that the optical properties of materials (reflectivity, transmittance, absorptivity, etc.) occur stably and reversibly color change under the action of external electric field, which shows the reversibility of color and transparency in appearance. Since the discovery of electrochromism in 1960s, this technology has been used for more than 40 years, because the electrochromic materials have properties of low driving voltage and bistability, it can be applied in energy-saving smart windows of construction technology, car roof window, anti-glare rear view mirrors, electronic paper and display device. In the application of energy-saving glass and energy-saving smart window, it can achieve better heat preservation and insulation, to reduce the energy consumption of buildings and achieve the effect of energy conservation and environmental protection. Therefore, the development of this technology is very competitive and commercial value. Electrochromic glass is usually used two transparent conductive film as electrodes, there are the ion barrier material, the electrochromic material layer, the ion conductive layer, the ion storage layer and the protective layer between therein. The electrochromic component generally includes a transparent conductive layer, an electrochromic layer and an electrolyte layer, which are supported by a transparent substrate or placed between two transparent substrates. The electrolyte layer is the transmission channel of ions required by the electrochromic effect, and the transmission channel is divided into solid electrolyte and liquid electrolyte. The present disclosure uses multilayer solid-state inorganic composite conductive film to form a transparent conductive film structure, which is applied in inorganic solid-state electrochromic module, and the structure is conducive to the large-scale production of inorganic solid-state electrochromic module.

Refer to patent CN101510038B, the preparation method of all solid-state electrochromic component often uses indium tin oxide transparent conductive film. Because the indium tin oxide transparent conductive film contains rare earth metal indium, its material manufacturing cost is high, which is unfavorable for the cost reduction of all solid-state electrochromic component. Therefore, the present disclosure use transparent conductive boron-doped zinc oxide material with high visible light transmittance to replace it, which does not contain rare earth metal indium, so it effective reduces the cost of module material.

Refer to the patent CN103771724B, in all solid-state filmy electrochromic glass and its preparation method, the thickness of single-layered transparent conductive layer is 200-300 nm, and the thickness of double-layered transparent conductive layer is 400-600 nm. In the bleached state, the visible light transmittance is lower than 85%, the increasing of thickness makes the visible light transmittance of all solid-state film electrochromic component decrease, leading to the decrease of transparency. Therefore, the present disclosure make use of boron-doped zinc oxide material can reduce the thickness of transparent conductive layer, to increase the visible light transmittance, and use transparent metal layer to increase the conductivity, so that the thickness of the whole transparent conductive layer is reduced, the transmittance increases, and the conductivity is better.

In patent CN104570534B, the transparent substrate of an all solid-state inorganic electrochromic component and its preparation method is to deposit solid-state film by using indium zinc oxide film material and plasma enhanced chemical vapor deposition method, thus increasing, the cost of material layer and the discontinuity of vacuum coating process.

Compared with the all solid-state electrochromic component prepared by other single or composite methods, the device provided with the structure of the present disclosure solves the following problems in the background technology, such as high material cost, low visible light transmittance, slow conductive reaction speed and high sheet resistance of transparent conductive film. The structure of the present disclosure has the advantages in low material cost, thin film thickness, large adjustment range of visible light transmittance, and reduces the sheet resistance of the transparent conductive film, increases the conductive reaction speed of all solid-state electrochromic module, increases the transparency of the electrochromic module, and the present disclosure can use continuous vacuum sputtering, which is contributed for the large-scale production of inorganic solid-state electrochromic module.

SUMMARY

In view of the defect of the prior art, the present disclosure is to provide an inorganic solid-state electrochromic module containing an inorganic transparent conductive film, to solve the problems of the prior art, such as high cost of the material, low visible light transmittance, slow conductive reaction speed and high sheet resistance of the transparent conductive film.

To achieve the above object, the present disclosure is realized by the following technical solution: An inorganic solid-state electrochromic module containing an inorganic transparent conductive film, including a transparent substrate, and a first transparent conductive layer, a first transparent metal layer, a first transparent protective layer, an inorganic electrochromic layer, an inorganic ion conductive layer, an inorganic ion storage layer, a second transparent metal layer, a second transparent protective layer and a second transparent conductive layer, a encapsulating film and a transparent front plate formed on the transparent substrate in sequence. The top of the transparent substrate is fixedly connected to the bottom of the first transparent conductive layer, and the top of the first transparent conductive layer is fixedly connected to the bottom of the first transparent metal layer, the top of the first transparent metal layer is connected to the bottom of the first transparent protective layer, the top of the first transparent protective layer is fixedly connected to the bottom of the inorganic electrochromic layer, the top of the inorganic electrochromic layer is fixedly connected to the bottom of the inorganic ion conductive layer, the top of the inorganic ion conductive layer is fixedly connected to the bottom of the inorganic ion storage layer, the top of the inorganic ion storage layer is fixedly connected to the bottom of the second transparent metal layer, the top of the second transparent metal layer is fixedly connected to the bottom of the second transparent protective layer, the top of the second transparent protective layer is fixedly connected to the bottom of the second transparent conductive layer, the top of the second transparent conductive layer is fixedly connected to the bottom of the encapsulating film, and the top of the encapsulating film is fixedly connected to the bottom of the transparent front plate.

Preferably, the transparent substrate is made of a transparent glass substrate or a transparent polymer flexible substrate, and both the first transparent conductive layer and the second transparent conductive layer are made of a boron-doped zinc oxide material.

Preferably, the first transparent metal layer and the second transparent metal layer are both formed of silver, aluminum or alloy thin films with a thickness of 1-10 nm by a vacuum sputtering method to form transparent metal layers; and the first transparent protective layer and the second transparent protective layer are both formed of titanium thin films with a thickness of 1-10 nm by the vacuum sputtering method to form transparent protective layers.

Preferably, the inorganic electrochromic layer is formed of a tungsten oxide electrochromic film with a film thickness of 150-300 nm by a vacuum sputtering method, thereby forming an electrochromic layer; and the inorganic ion conductive layer is formed of a metal lithium ion transport layer with a film thickness of 10-150 nm by the vacuum sputtering method, thereby forming an inorganic ion conductive layer.

Preferably, the inorganic ion storage layer is formed of a nickel oxide ion storage film with a film thickness of 100-350 nm by a vacuum sputtering method, thereby forming an inorganic ion storage layer.

Preferably, the encapsulating film is used a polyvinyl butyral film or an ethylene-vinyl acetate copolymer film as material, to bond an all solid-state thin-film electrochromic component and a transparent front plate together to form an all solid-state thin-film electrochromic module.

Preferably, the transparent front plate is made of a transparent glass front plate or a transparent polymer flexible front plate.

The present disclosure further discloses a method for preparing an inorganic solid-state electrochromic module containing an inorganic transparent conductive film, including the following steps:

S1 of providing a transparent glass substrate with a thickness of 2 mm as a substrate, providing a boron-doped zinc oxide target material as a film material, coating the first transparent conductive layer by a vacuum sputtering coating method. Wherein the relatively low-cost zinc-containing transparent conductive film is used as main material, and the thickness of the zinc-containing transparent conductive film is about 80-100 nm;

S2 of providing a metallic silver target material, coating a first transparent metal layer with a film thickness of 7-10 nm on the first transparent conductive layer by a vacuum sputtering coating method, thereby forming a transparent metal layer;

S3 of providing a titanium metal target material, coating a titanium thin film with a film thickness of 5-8 nm on the first transparent metal layer by a vacuum sputtering coating method to protect the first transparent metal layer from oxidation or vulcanization, thereby forming a transparent protective layer.

Advantageous Effects

The present disclosure provides an inorganic solid-state electrochromic module containing an inorganic transparent conductive film. Compared with the prior art, it has the following advantageous effects: the inorganic solid-state electrochromic module containing an inorganic transparent conductive film can improve the stability of the electrochromic module and the wide range of visible light transmittance regulation, increase the conductive reaction speed of the all solid-state electrochromic module, increase the transparency of the electrochromic element, and reduce the sheet resistance of the transparent conductive film, realizing the fast electrochromic speed of the all solid state, at the same time, the overall thickness is also reduced to a large extent, and the cost is lower. By using the transparent conductive film containing boron-doped zinc oxide material without rare earth component, instead of using the indium tin oxide transparent conductive film material with rare earth component, can effectively reduce the cost of the material. The use of high visible light transmittance of boron-doped zinc oxide material can make a wider regulation range of the visible light transmittance of the all solid-state film electrochromic module. With the wide range of transmittance regulation, the high visible light transmittance of the boron-doped zinc oxide material makes the all solid-state electrochromic module increase the visible light transparency when the power is off. And by using the transparent metal layer material makes the overall sheet resistance of the multilayer solid-state inorganic composite transparent conductive film decrease. Because the sheet resistance of the transparent conductive film composed of the multilayer solid-state inorganic composite film is reduced, the intensity of the potential is increased. With the increase of electric field intensity, the electrochromic reaction speed of all solid-state electrochromic module is accelerated.

BRIEF DESCRIPTION OF THE DRAWINGS

FIG. 5 is a comparison diagram showing the results between the embodiments of the present disclosure.

Figure 1:
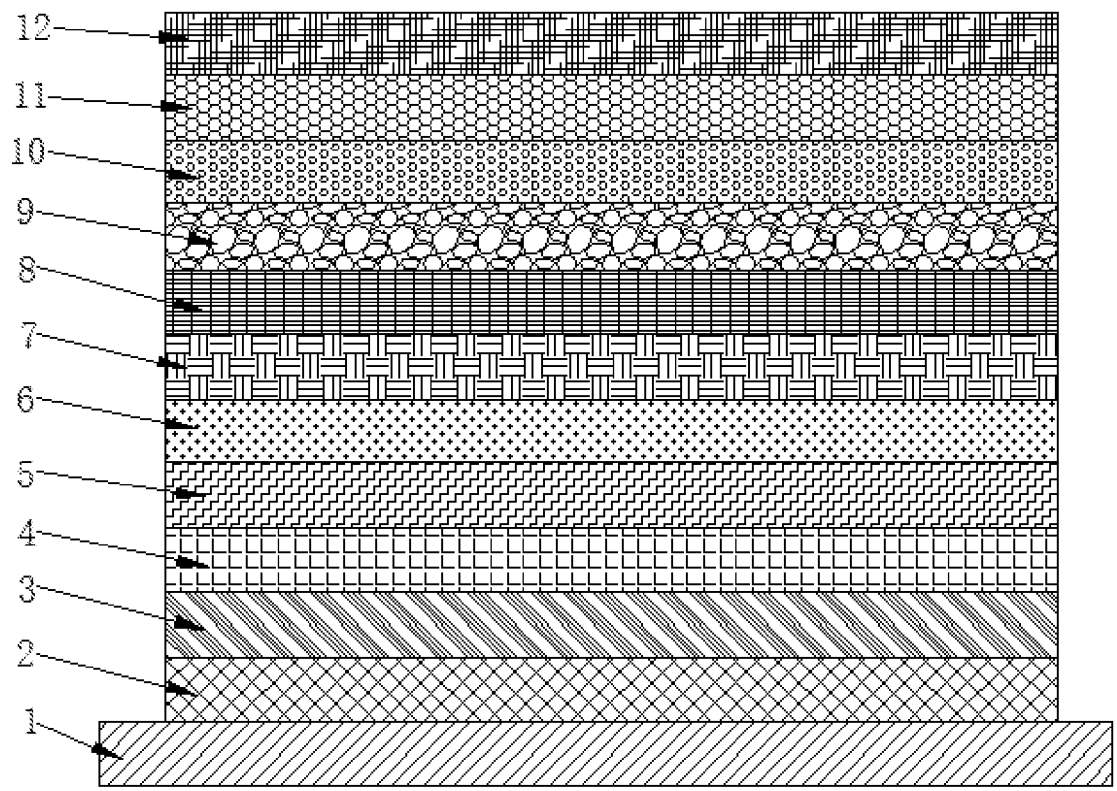
FIG. 1 is a diagram showing the structure of the all solid-state electrochromic module according to the present disclosure.

In the drawings, 1 transparent substrate, 2 first transparent conductive layer, 3 first transparent metal layer, 4 first transparent protective layer, 5 inorganic electrochromic layer, 6 inorganic ion conductive layer, 7 inorganic ion storage layer, 8 second transparent metal layer, 9 second transparent protective layer, 10 second transparent conductive layer, 11 encapsulating film and 12 transparent front plate.

DETAILED DESCRIPTION OF THE EMBODIMENTS

The technical solution in the embodiment of the present disclosure will be clearly and completely described in combination with the drawings in the embodiment of the present disclosure. It is apparent that the described embodiment is merely a part of the embodiments of the present disclosure, not all of the embodiments. Based on the embodiments in the present disclosure, all other embodiments obtained by those skilled in the art without creative labor are fallen within the scope of the present disclosure.

Referring to FIG. 1-5, the present disclosure provides two technical solutions as embodiments. The preparation method of inorganic solid-state electrochromic module containing inorganic transparent conductive film has the following embodiments:

Embodiment 1

Figure 2:
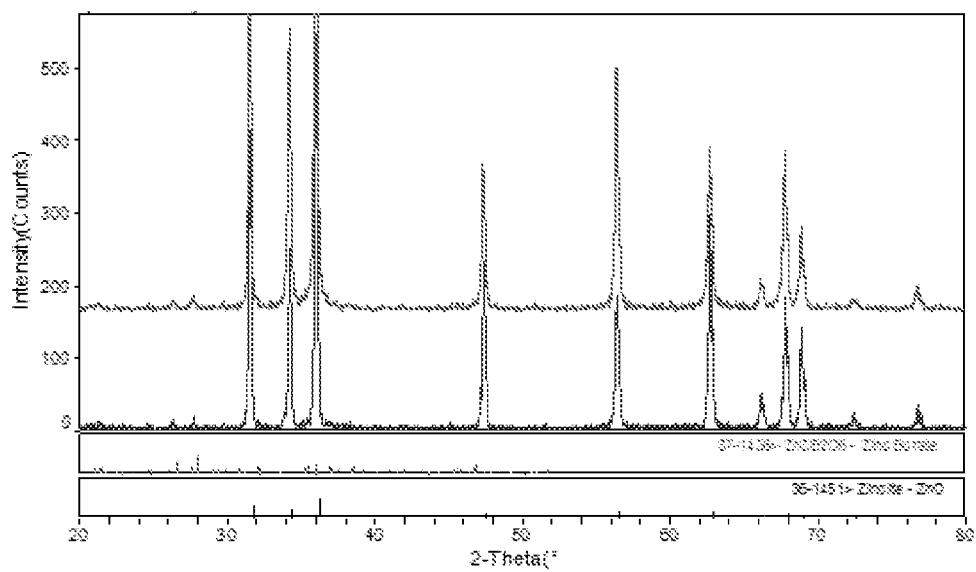
FIG. 2 is the X-ray spectrum diagram of the boron-doped zinc oxide transparent conductive film according to the present disclosure.
Figure 3:
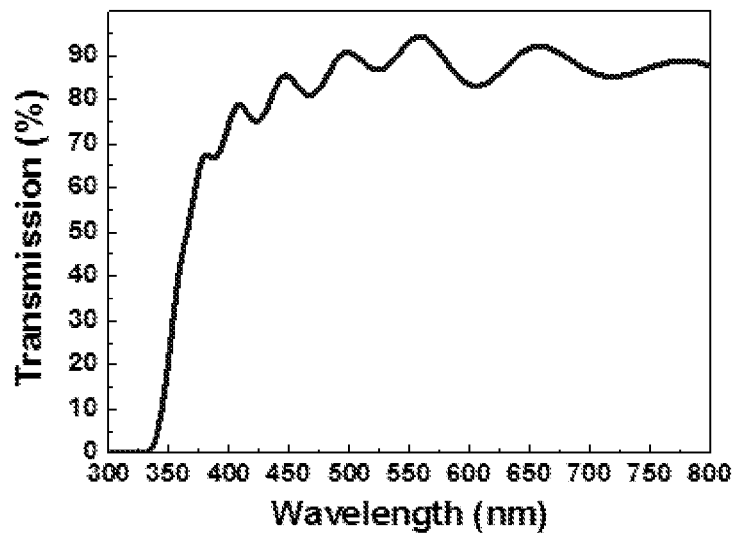
FIG. 3 is the transmittance spectrum diagram of the boron-doped zinc oxide transparent conductive film according to the present disclosure.
Figure 4:
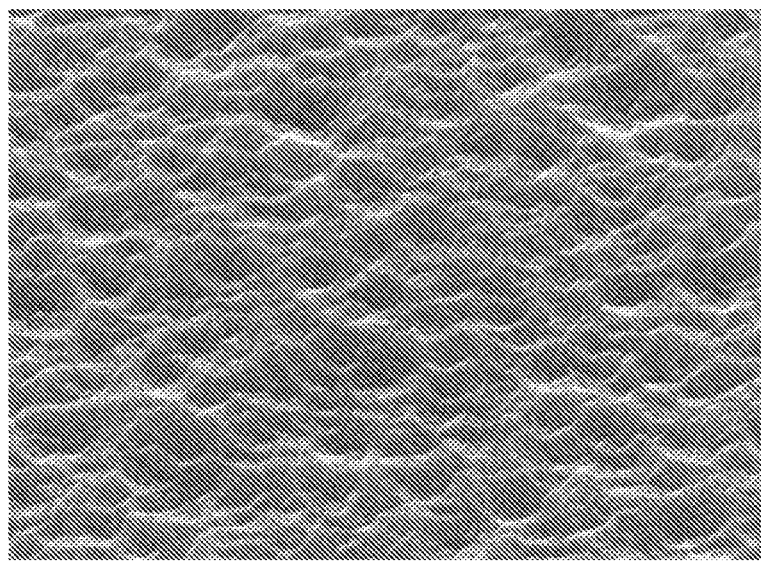
FIG. 4 is the diagram showing the surface of the boron-doped zinc oxide transparent conductive film under an electron microscope according to the present disclosure.

S1. Using a transparent glass substrate with a film thickness of 2 mm as substrate, using boron-doped zinc oxide target material as film material, the first transparent conductive layer is coated by vacuum sputtering. In this embodiment, a zinc oxide base boron-doped zinc oxide ceramic target material doped with boron trioxide is placed in the reaction chamber, the range of the doped boron trioxide is 1 at %-2 at %, and argon gas with flow rate of 40 sccm is introduced, the sputtering power density is 2.5 watts per square centimeter ($W/cm^2$), the sputtering thickness is 98 nm, the vacuum pressure is 50 millitorr (mTorr), the distance between the target material and the substrate is 5 cm, and the temperature is 200° C., which solves the high cost problem of the transparent conductive film containing rare earth indium element. The relatively low-cost transparent conductive film containing zinc element is used as the main material, and the X-ray spectrum diagram of the transparent conductive film doped with zinc oxide is shown in FIG. 2, the transmission spectrum of the transparent conductive film doped with zinc oxide is shown in FIG. 3, and the surface of the boron-doped zinc oxide transparent conductive film under an electron microscope is shown in FIG. 4;

S2. Coating a silver transparent metal layer with a thickness of 7 nm on the first transparent conductive layer by vacuum sputtering with a silver metal target material. In this embodiment, a silver metal target material is placed in the reaction chamber, the purity range of the silver metal target material is 99.9-99.99, and argon gas with a flow rate of 30 sccm is introduced, the sputtering power density is 1.2 watts per square centimeter ($W/cm^2$), the sputtering thickness is 7 nm, the vacuum pressure is 63 millitorr (mTorr), the distance between the target material and the substrate is 5 cm, and the temperature is 150° C.;

S3. Coating a titanium film with a thickness of 8 nm on the first transparent metal layer by vacuum sputtering with titanium metal target material to protect the first transparent metal layer from oxidation or vulcanization, thereby forming the first transparent protective layer. In this embodiment, the metal titanium target material is placed in the reaction chamber, the purity range of the metal titanium target material is 99.9-99.99, and the argon gas with the flow rate of 25 sccm is introduced, the sputtering power density is 1.6 watts per square centimeter ($W/cm^2$), the sputtering thickness is 8 nm, the vacuum pressure is 65 millitorr (mTorr), the distance between the target material and the substrate is 5 cm, and the temperature is 125° C.;

S4. Forming a layer of tungsten oxide electrochromic film with a thickness of 200 nm by vacuum sputtering, and then an electrochromic layer is formed. In this embodiment, a metal tungsten target material is placed in the reaction chamber, the purity range of the metal tungsten target material is 99.9-99.99, and argon gas with a flow rate of 25 sccm and oxygen with a flow rate of 8 sccm are introduced, and the sputtering power density is 3.1 watts per square centimeter ($W/cm^2$), the sputtering thickness is 200 nm, the vacuum pressure is 65 millitorr (mTorr), the distance between the target material and the substrate is 5 cm, and the temperature is 125° C.;

S5. Forming a layer of metal lithium ion transport film with a film thickness of 125 nm by vacuum sputtering, and then an inorganic ion conductive layer is formed. In this embodiment, a metal lithium target material is placed in the reaction chamber, and the purity range of the metal lithium target material is 99.9-99.99, and argon gas with a flow rate of 25 sccm and oxygen with a flow rate of 6 sccm are introduced, and the sputtering power density is 2.8 watts per square centimeter ($W/cm^2$), the sputtering thickness is 125 nm, the vacuum pressure is 65 millitorr (mTorr), the distance between the target material and the substrate is 5 cm, and the temperature is 125° C.;

S6. Forming a layer of nickel oxide ion storage layer film with a thickness of 100 nm by vacuum sputtering, and then an inorganic ion storage layer is formed. In this embodiment, a metal nickel target material is placed in the reaction chamber, the purity range of the metal nickel target material is 99.9-99.99, and argon gas with a flow rate of 25 sccm and oxygen with a flow rate of 6 sccm are introduced, and the sputtering power density is 28 watts per square centimeter ($W/cm^2$), the sputtering thickness is 100 nm, the vacuum pressure is 65 millitorr (mTorr), the distance between the target material and the substrate is 5 cm, and the temperature is 125° C.;

S7. Coating a silver transparent metal layer with a thickness of 7 nm on the inorganic ion storage layer by vacuum sputtering with a metal silver target material, thereby a second transparent metal layer is formed. In this embodiment, a metal silver target material is placed in the reaction chamber, the purity range of the metal silver target material is 99.9-99.99, and argon gas with a flow rate of 30 sccm is introduced, and the sputtering power density is 1.2 watts per square centimeter ($W/cm^2$) the sputtering thickness is 7 nm, the vacuum pressure is 63 millitorr (mTorr), the distance between the target material and the substrate is 5 cm, and the temperature is 150° C.;

S8. Coating a titanium thin film with a thickness of 8 nm on the second transparent metal layer by vacuum sputtering with metal titanium target material to protect the second transparent metal layer from oxidation or sulfurization, thereby a second transparent protective layer is formed. In this embodiment, a metal titanium target material is placed in the reaction chamber, the purity range of the metal titanium target material 99.9-99.99 and an argon flow rate of 25 sccm, the sputtering power density is 1.6 watts per square centimeter ($W/cm^2$), the sputtering thickness is 8 nm, the vacuum pressure is 65 millitorr (mTorr), the distance between the target material and the substrate is 5 cm, and the temperature is 125° C.;

S9. Coating boron-doped zinc oxide with a thickness of 98 nm on the second transparent protective layer by vacuum sputtering to form a second transparent conductive film layer. In this embodiment, a zinc oxide based boron-doped zinc oxide ceramic target material doped with boron trioxide is placed in the reaction chamber, the range of doped boron trioxide is from 1 at % to 2 at %, and argon gas with the flow rate of 40 sccm is introduced, the sputtering power density is 2.5 watts per square centimeter ($W/cm^2$), the sputtering thickness is 98 nm, the vacuum pressure is 50 millitorr (mTorr), the distance between the target material and the substrate is 5 cm, and the temperature is 200° C.;

S10. After then, the glass laminating machine is used to lay the encapsulating film n the all solid-state film electrochromic component. The encapsulating film can be made of polyvinyl butyral (PVB) film or ethylene-vinyl acetate copolymer (EVA) film, and the transparent front plate glass is laid on the encapsulating film, and then the subsequent lamination is carried out. The gluing process is carried out by the laminating machine or autoclave at temperature of 125° C. for 25 minutes, and then the laminating module is obtained;

S11. bonding the all solid-state film electrochromic component with the transparent front plate together to form a all solid-state film electrochromic module. The shading coefficient of the all solid-state film electrochromic module made in embodiment 1 is 0.9. The use of the above new structure, as shown in FIG. 1, is conducive to reflect the fast speed of the all solid-state electrochromic module, and the overall thickness is greatly reduced, the cost is also lower. And the present disclosure is beneficial to the large-scale production of inorganic solid-state electrochromic module.

Embodiment 2

S1. Using a transparent glass substrate with a film thickness of 2 mm as substrate, using boron-doped zinc oxide target material as film material, the first transparent conductive layer is coated by vacuum sputtering. In this embodiment, a zinc oxide base boron-doped zinc oxide ceramic target material doped with boron trioxide is placed in the reaction chamber, the range of the doped boron trioxide is 1 at %-2 at %, and argon gas with flow rate of 40 sccm is introduced, the sputtering power density is 2.5 watts per square centimeter ($W/cm^2$), the sputtering thickness is 83 nm, the vacuum pressure is 50 millitorr (mTorr), the distance between the target material and the substrate is 5 cm, and the temperature is 200° C., which solves the high cost problem of the transparent conductive film containing rare earth indium element. The relatively low-cost transparent conductive film containing zinc element is used as the main material, and the X-ray pattern of the transparent conductive film doped with zinc oxide is shown in FIG. 2;

S2. Coating an aluminum transparent metal layer with a thickness of 10 nm on the first transparent conductive layer by vacuum sputtering with metal aluminum target material. In this embodiment, a metal aluminum target material is placed in the reaction chamber, the purity range of the metal aluminum target material is 99.95-99.99, and argon gas with a flow rate of 30 sccm is introduced, the sputtering power density is 1.2 watts per square centimeter ($W/cm^2$), the sputtering thickness is 10 nm, the vacuum pressure is 63 millitorr (mTorr), the distance between the target material and the substrate is 5 cm, and the temperature is 145° C.;

S3. Coating a titanium film with a thickness of 5 nm on the first transparent metal layer by vacuum sputtering with metal titanium target material to protect the first transparent metal layer from oxidation or vulcanization, thereby forming the first transparent protective layer. In this embodiment, the metal titanium target material is placed in the reaction chamber, the purity range of the metal titanium target material is 99.9-99.99, and the argon gas with the flow rate of 25 sccm is introduced, the sputtering power density is 1.6 watts per square centimeter ($W/cm^2$), the sputtering thickness is 5 nm, the vacuum pressure is 65 millitorr (mTorr), the distance between the target material and the substrate is 5 cm, and the temperature is 125° C.;

S4. Forming a layer of tungsten oxide electrochromic film with a thickness of 200 nm by vacuum sputtering, and then an electrochromic layer is formed. In this embodiment, a metal tungsten target material is placed in the reaction chamber, the purity range of the metal tungsten target material is 99.9-99.99, and argon gas with a flow rate of 25 sccm and oxygen with a flow rate of 8 sccm are introduced, and the sputtering power density is 3.1 watts per square centimeter ($W/cm^2$), the sputtering thickness is 200 nm, the vacuum pressure is 65 millitorr (mTorr), the distance between the target material and the substrate is 5 cm, and the temperature is 125° C.;

S5. Forming a layer of metal lithium ion transport film with a film thickness of 125 nm by vacuum sputtering, and then an inorganic ion conductive layer is formed. In this embodiment, a metal lithium target material is placed in the reaction chamber, and the purity range of the metal lithium target material is 99.9-99.99, and argon gas with a flow rate of 25 sccm and oxygen with a flow rate of 6 sccm are introduced, and the sputtering power density is 2.8 watts per square centimeter ($W/cm^2$), the sputtering thickness is 125 nm, the vacuum pressure is 65 millitorr (mTorr), the distance between the target material and the substrate is 5 cm, and the temperature is 125° C.;

S6. Forming a layer of nickel oxide ion storage layer film with a thickness of 100 nm by vacuum sputtering, and then an inorganic ion storage layer is formed. In this embodiment, a metal nickel target material is placed in the reaction chamber, the purity range of the metal nickel target material is 99.9-99.99, and argon gas with a flow rate of 25 sccm and oxygen with a flow rate of 6 sccm are introduced, and the sputtering power density is 2.8 watts per square centimeter ($W/cm^2$), the sputtering thickness is 100 nm, the vacuum pressure is 65 millitorr (mTorr), the distance between the target material and the substrate is 5 cm, and the temperature is 125° C.;

S7. Coating a transparent metal layer with a thickness of 10 nm on the first transparent conductive layer by vacuum sputtering with a metal aluminum target material, thereby a first transparent metal layer is formed. In this embodiment, a metal aluminum target material is placed in the reaction chamber, the purity range of the metal aluminum target material is 99.95-99.99, and argon gas with a flow rate of 30 sccm is introduced, and the sputtering power density is 1.2 watts per square centimeter ($W/cm^2$), the sputtering thickness is 10 nm, the vacuum pressure is 63 millitorr (mTorr), the distance between the target material and the substrate is 5 cm, and the temperature is 145° C.;

S8. Coating a titanium thin film with a thickness of 5 nm on the second transparent metal layer by vacuum sputtering with metal titanium target material to protect the second transparent metal layer from oxidation or vulcanization, thereby a second transparent protective layer is formed. In this embodiment, a metal titanium target material is placed in the reaction chamber, the purity range of the metal titanium target material 99.9-99.99 and an argon flow rate of 25 sccm is introduced, the sputtering power density is 1.6 watts per square centimeter ($W/cm^2$), the sputtering thickness is 8 m, the vacuum pressure is 65 millitorr (mTorr), the distance between the target material and the substrate is 5 cm, and the temperature is 125° C.;

S9. Coating boron-doped zinc oxide with a thickness of 83 nm on the second transparent protective layer by vacuum sputtering to form a second transparent conductive film layer, in this embodiment, a zinc oxide based boron-doped zinc oxide ceramic target material doped with boron trioxide is placed in the reaction chamber, the range of doped boron trioxide is from 1 at % to 2 at %, and argon gas with the flow rate of 40 sccm is introduced, the sputtering power density is 2.5 watts per square centimeter ($W/cm^2$) the sputtering thickness is 98 m, the vacuum pressure is 50 millitorr (mTorr), the distance between the target material and the substrate is 5 cm, and the temperature is 200° C.;

S10. After then, the glass laminating machine is used to lay the encapsulating film on the all solid-state film electrochromic component. The encapsulating film can be made of polyvinyl butyral (PVB) film or ethylene-vinyl acetate copolymer (EVA) film, and the transparent front plate glass is laid on the encapsulating film, and then the subsequent lamination is carried out. The gluing process is carried out by the laminating machine or autoclave at temperature of 125° C. for 25 minutes, and then the laminating module is obtained;

S11. Bonding the all solid-state film electrochromic component with the transparent front plate together to form an all solid-state film electrochromic module. The shading coefficient of the all solid-state film electrochromic module made in the present embodiment is 0.9. The use of the above new structure, as shown in FIG. 1, is conducive to reflect the fast speed of the all solid-state electrochromic module, and the overall thickness is greatly reduced, the cost is also lower. And the present disclosure is beneficial to the large-scale production of inorganic solid-state electrochromic module.

It should be noted that in this paper, relational terms such as first and second etc. are only used to distinguish one entity or operation from another, and do not necessarily require or imply any such actual relationship or order between these entities or operations. Moreover, the term "include", "including" or any other variation thereof is intended to cover non exclusive inclusion so that a process, method, article or device including a series of elements includes not only those elements, but also other elements not explicitly listed, or elements inherent to such process, method, article or device.

Although embodiments of the present disclosure have been shown and described, it should be understood to those skilled in the art that various changes, modifications, substitutions and transformations can be made to these embodiments without departing from the principles and spirit of the present disclosure, and the scope of the present disclosure is defined by the appended claims and their equivalents.

What is claimed is:

1. An inorganic solid-state electrochromic module comprising:
    a transparent substrate, and a first transparent conductive layer, a first transparent metal layer, a first transparent protective layer, an inorganic electrochromic layer, an inorganic ion conductive layer, an inorganic ion storage layer, a second transparent metal layer, a second transparent protective layer and a second transparent conductive layer, an encapsulating film and a transparent front plate formed on the transparent substrate in sequence;
    the top of the transparent substrate is fixedly connected to the bottom of the first transparent conductive layer, and the top of the first transparent conductive layer is fixedly connected to the bottom of the first transparent metal layer, the top of the first transparent metal layer is connected to the bottom of the first transparent protective layer, the top of the first transparent protective layer is fixedly connected to the bottom of the inorganic electrochromic layer, the top of the inorganic electrochromic layer is fixedly connected to the bottom of the inorganic ion conductive layer, the top of the inorganic ion conductive layer is fixedly connected to the bottom of the inorganic ion storage layer, the top of the inorganic ion storage layer is fixedly connected to the bottom of the second transparent metal layer, the top of the second transparent metal layer is fixedly connected to the bottom of the second transparent protective layer, the top of the second transparent protective layer is fixedly connected to the bottom of the second transparent conductive layer, the top of the second transparent conductive layer is fixedly connected to the bottom of the encapsulating film, and the top of the encapsulating film is fixedly connected to the bottom of the transparent front plate;
    wherein the transparent substrate is made of a transparent glass substrate or a transparent polymer flexible substrate, and both the first transparent conductive layer and the second transparent conductive layer are made of a boron-doped zinc oxide material;
    wherein the first transparent metal layer and the second transparent metal layer are both formed of silver, aluminum or alloy thin films with a thickness of 1-10 nm by a vacuum sputtering method to form transparent metal layers; and the first transparent protective layer and the second transparent protective layer are both formed of titanium thin films with a thickness of 1-10 nm by the vacuum sputtering method to form transparent protective layers.

2. The inorganic solid-state electrochromic module according to claim 1, wherein the inorganic electrochromic layer is formed of a tungsten oxide electrochromic film with a film thickness of 150-300 nm by a vacuum sputtering method to form an electrochromic layer; and the inorganic ion conductive layer is formed of a metal lithium ion transport layer with a film thickness of 10-150 nm by a vacuum sputtering method to form an inorganic ion conductive layer.

3. The inorganic solid-state electrochromic module according to claim 1, wherein the inorganic ion storage layer is formed of a nickel oxide ion storage film with a film thickness of 100-350 nm by a vacuum sputtering method to form an inorganic ion storage layer.

4. The inorganic solid-state electrochromic module according to claim 1, wherein the encapsulating film is used a polyvinyl butyral film or an ethylene-vinyl acetate copolymer film as material to bond an all solid-state thin-film electrochromic component and a transparent front plate together to form an all solid-state thin-film electrochromic module.

5. The inorganic solid-state electrochromic module according to claim 1, wherein the transparent front plate is made of a transparent glass front plate or a transparent polymer flexible front plate.

6. A method for preparing an inorganic solid-state electrochromic module according to claim 1, comprising:
    S1, providing a transparent glass substrate with a thickness of 2 mm as a substrate, providing a boron-doped zinc oxide target material as a film material, coating the first transparent conductive layer by a vacuum sputtering coating method; wherein the relatively low-cost zinc-containing transparent conductive film is used as main material, and the thickness of the zinc-containing transparent conductive film is about 80-100 nm;
    S2, providing a metal silver target material, coating a first transparent metal layer with a film thickness of 7-10 nm on the first transparent conductive layer by the vacuum sputtering coating method to form a transparent metal layer;
    S3, providing a titanium metal target material, coating a titanium thin film with a film thickness of 5-8 nm on the first transparent metal layer by the vacuum sputtering coating method to protect the first transparent metal layer from oxidation or vulcanization to form a transparent protective layer.

* * * * *